(12) United States Patent
Hsu

(10) Patent No.: US 8,353,708 B2
(45) Date of Patent: Jan. 15, 2013

(54) INDEPENDENT LOADING MECHANISM FACILITATING INTERCONNECTIONS FOR BOTH CPU AND FLEXIBLE PRINTED CABLE

(75) Inventor: Shuo-Hsiu Hsu, New Taipei (TW)

(73) Assignee: Hon Hai Precision Inc. Co., Ltd., New Taipei (TW)

( * ) Notice: Subject to any disclaimer, the term of this patent is extended or adjusted under 35 U.S.C. 154(b) by 0 days.

(21) Appl. No.: 13/110,880

(22) Filed: May 18, 2011

(65) Prior Publication Data

US 2011/0287639 A1    Nov. 24, 2011

(30) Foreign Application Priority Data

May 18, 2010   (TW) ...................... 200990209276 A

(51) Int. Cl.
*H01R 12/00*    (2006.01)
(52) U.S. Cl. ........................................................ 439/67
(58) Field of Classification Search ............... 439/67, 439/77, 493, 495, 330, 342, 331
See application file for complete search history.

(56) References Cited

U.S. PATENT DOCUMENTS

| 6,969,270 | B2 | 11/2005 | Renfro et al. | |
|---|---|---|---|---|
| 7,148,428 | B2 * | 12/2006 | Meier et al. | 174/260 |
| 7,473,121 | B2 * | 1/2009 | Fan et al. | 439/342 |
| 2008/0070426 | A1 * | 3/2008 | Ma | 439/65 |
| 2008/0242122 | A1 * | 10/2008 | Ma et al. | 439/66 |
| 2008/0280474 | A1 * | 11/2008 | Fan et al. | 439/266 |
| 2009/0017644 | A1 * | 1/2009 | Fan et al. | 439/42 |
| 2009/0023330 | A1 * | 1/2009 | Stoner et al. | 439/493 |
| 2009/0075493 | A1 * | 3/2009 | Ma | 439/55 |

* cited by examiner

*Primary Examiner* — Tulsidas C Patel
*Assistant Examiner* — Phuongchi Nguyen
(74) *Attorney, Agent, or Firm* — Wei Te Chung; Ming Chieh Chang

(57) ABSTRACT

An electrical connector assembly comprises a central processing unit (CPU), a plurality of cable connectors soldered on the CPU and a CPU socket for electrical connecting the CPU to a printed circuit board (PCB). Each cable connector includes a base having a plurality of first terminals received therein, for contacting with conductive points of the cable. The CPU socket includes an insulating housing having a plurality of second terminals received therein and a loading mechanism attached to the insulating housing. The loading mechanism can simultaneously pressing the cables against the cable connectors and the CPU toward the CPU socket for electrically connecting the CPU with the cables and the PCB.

6 Claims, 5 Drawing Sheets

INDEPENDENT LOADING MECHANISM FACILITATING INTERCONNECTIONS FOR BOTH CPU AND FLEXIBLE PRINTED CABLE

BACKGROUND OF THE INVENTION

1. Field of the Invention

The present invention relates to a socket assembly, and more particularly to a socket assembly incorporated with an independent loading mechanism facilitating simultaneously at least two independent interconnections between a CPU chip with respect to a socket and a cable and a cable connector located on a substrate on which the CPU is electrically seated.

2. Description of Related Art

An electrical connector assembly disclosed in U.S. Pat. No. 6,969,270 which is issued to Tim et al. on Nov. 29, 2005 includes an land grid array (LGA) socket mounted on a printed circuit board (PCB) for electrically connecting a central processing unit (CPU) with a plurality of conductive pads to the PCB, and a cable connector is integrated on the LGA socket for electrically connecting a cable with a plurality of conductive traces to the PCB through the LGA socket.

The LGA socket comprises an insulating housing having a plurality of first terminals received therein and a lever actuating the insulating housing to hold the CPU on the insulating housing. The first terminals are soldered to the PCB to achieve electrical connection between the LGA socket and the PCB. The LGA socket establishes electrical connection with the CPU through the first terminals contacting with the conductive pads of the CPU when the lever is driven to press depress the CPU to the insulating housing.

The cable connector for electrically connecting the cable with the LGA socket comprises a base having a plurality of second terminals received therein, a cover assembled to the base and rotatable relative to the base. The cover can position and load the cable against the cable connector to achieve electrical connection between the cable and the LGA socket through the second terminals contacting with the first terminals of the LGA socket, so as to achieve electrical connection between the cable and the CPU.

However, the electrical connector assembly establishing signal transmissions between CPUs by the cable passing through the LGA socket and the cable connector increases transmission paths and causes transmission speed slow. In addition, the electrical connector assembly presses the cable against the cable connector through the cover and presses the CPU against the LGA socket through the lever, thus make the electrical connector assembly having a complex structure and high cost.

Hence, it is desirable to provide an improved electrical connector assembly with a loading mechanism to overcome the aforementioned disadvantages.

SUMMARY OF THE INVENTION

Accordingly, an object of the present invention is to provide an electrical connector assembly with a loading mechanism for pressing a cable against a cable connector integrated on a CPU to simultaneously achieve electrical connection between the CPU and a PCB and signal transmissions between the CPUs through the cable.

According to one aspect of the present invention, an electrical connector assembly comprises a central processing unit (CPU) with a plurality of cable connectors integrated thereon and a CPU socket for electrically connecting the CPU to a printed circuit board (PCB). The cable connectors for electrically connecting the CPU with cables each includes a base having a plurality of first terminals received therein. The CPU socket comprises an insulating housing having a plurality of second terminals received therein and a loading mechanism attached to the insulating housing. The loading mechanism can press the cables assembled to the cable connectors integrated on the CPU, so as to simultaneously connecting the CPU with the cables and the PCB through the cable connectors and the CPU socket.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
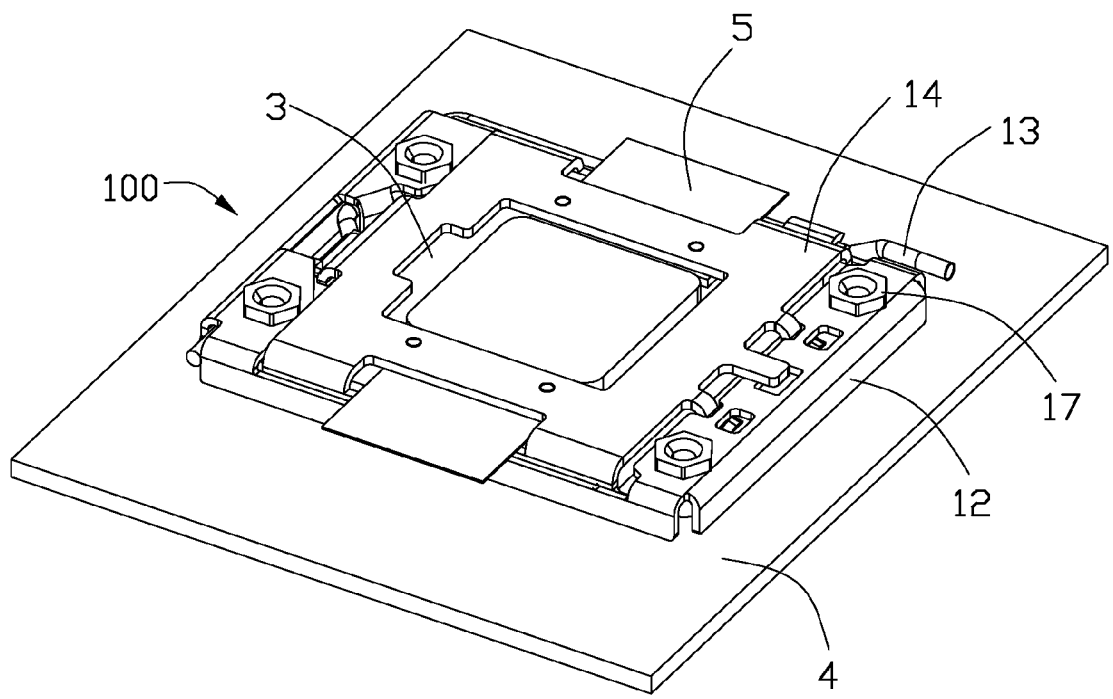
FIG. 1 is an assembled, isometric view of a preferred embodiment of an electrical connector assembly with a loading mechanism according to the present invention, showing the loading mechanism being located in a closed position.
Figure 2:
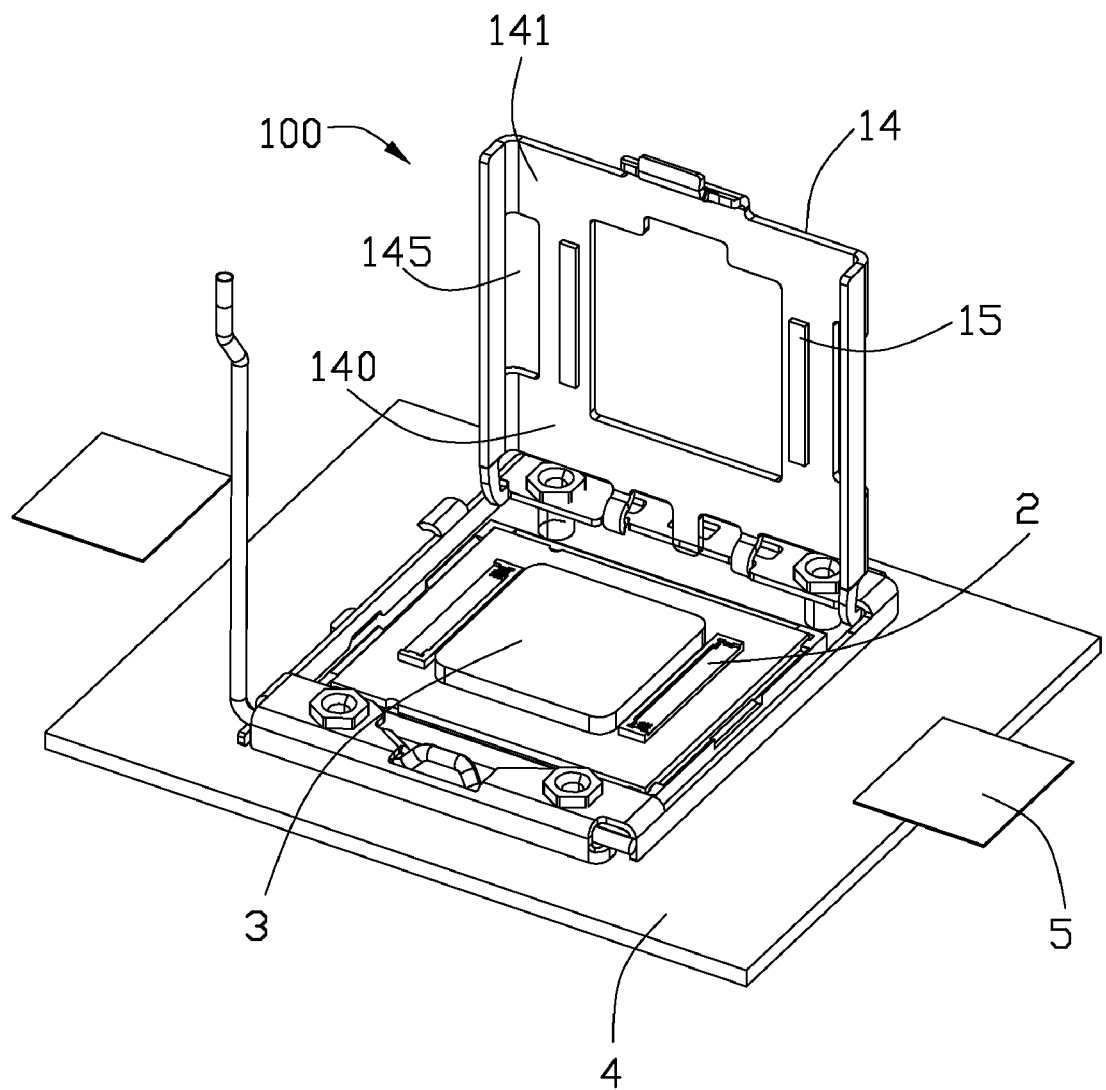
FIG. 2 is similar to FIG. 1, showing a cable separating from a cable connector and the loading mechanism being located in an open position.
Figure 3:
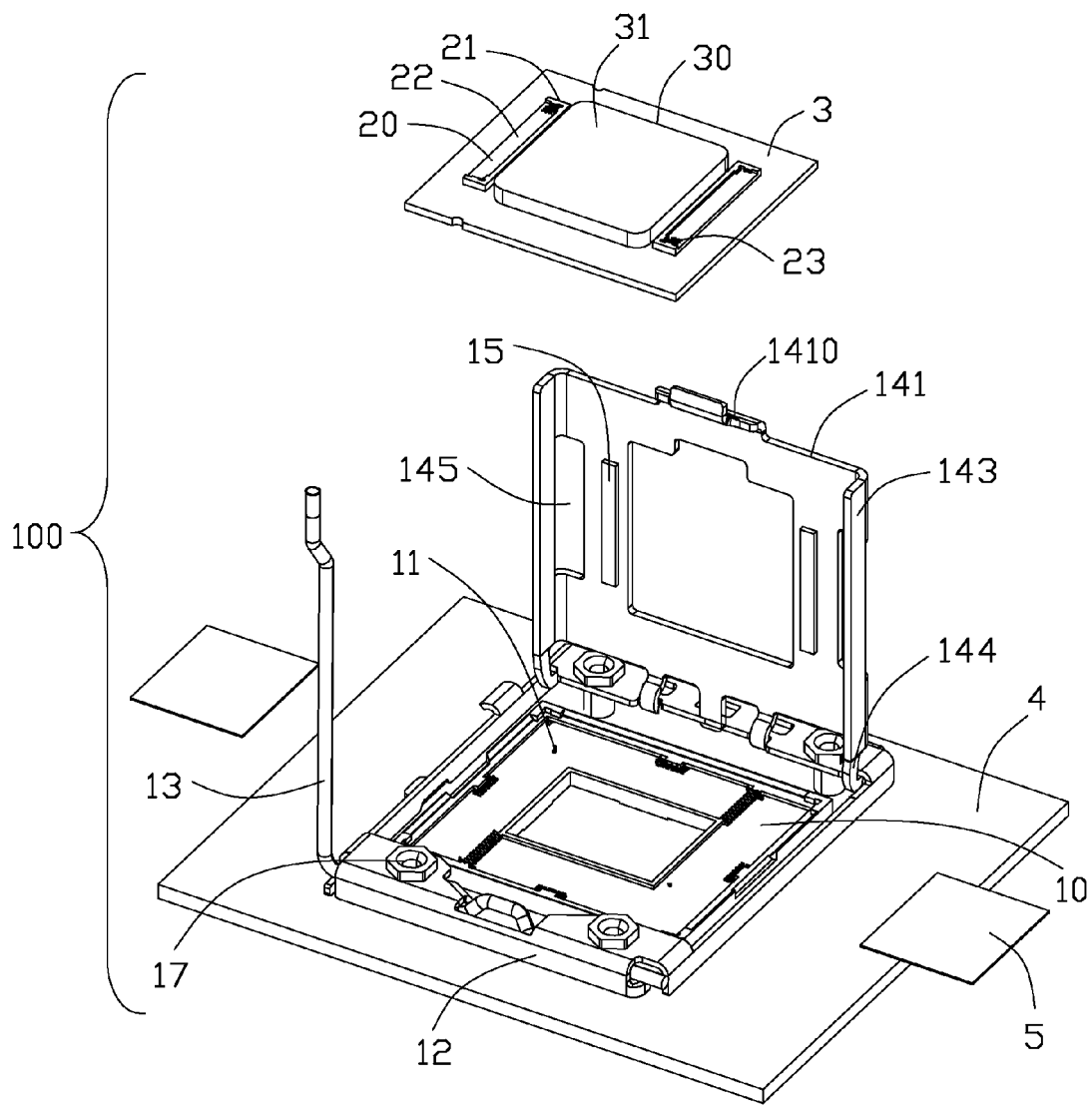
FIG. 3 is similar to FIG. 2, showing a CPU separating from a CPU socket of the electrical connector assembly.

FIGS. 1 to 3 illustrate an electrical connector assembly 100 in accordance to a preferred embodiment of the present invention is used for electrically connecting a central processing unit (CPU) 3 with a printed circuit board (PCB) 4 and achieves high-speed signal transmissions between CPUs 3 through cables 5. The electrical connector assembly 100 simultaneously electrically connecting the CPU 3 with cables 5 and the PCB 4 comprises a CPU socket 1 soldered on the PCB 4 and a pair of cable connectors 2 soldered on the CPU 3 for connecting the cables 5 to the CPU 3.

Referring to FIGS. 2 to 3, the CPU 3 includes a substrate 30 having a plurality of conductive pads (not shown) disposed at a bottom thereof and an electronic element 31 projecting from a central portion of the substrate 30. The two cable connectors 2 are integrated on the substrate 30 of the CPU 3 and located at two opposite sides of the electronic element 31 for connecting the cables 5 with the CPU 3. Each cable connector 2 comprises a base 20 having a plurality of first terminals 23 received therein, three sidewalls 21 surrounded the base 20, and a receiving space 22 formed by the base 20 and the sidewalls 21 for allowing the cable 5 to be inserted in a horizontal direction.

Figure 4:
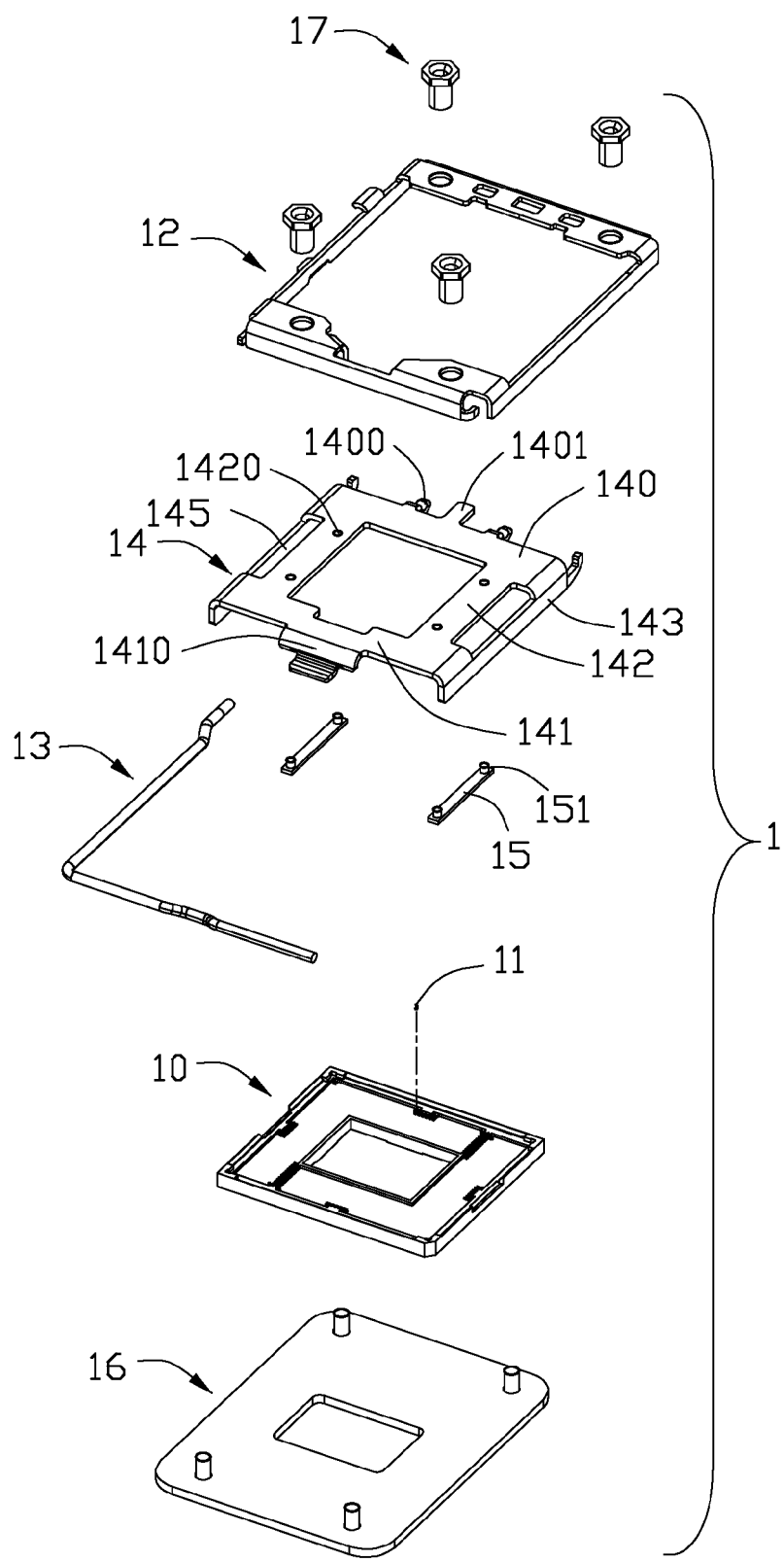
FIG. 4 is an exploded, perspective view of the CPU socket of the electrical connector assembly shown in FIG. 3.
Figure 5:
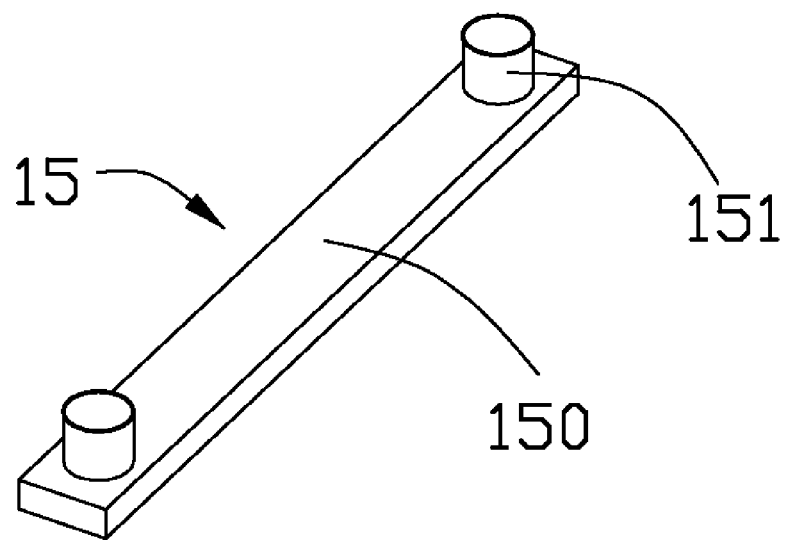
FIG. 5 is an isometric view of an elastic gasket of the loading mechanism shown in FIG. 4.

Referring to FIGS. 2 to 4, the CPU socket 1 for electrically connecting the CPU 3 to the PCB 4 comprises an insulating housing 10 having a plurality of second terminals 11 received therein, an independent loading mechanism (ILM) enclosingly attached to the insulating housing 10 for pressing the CPU 3 toward the insulating housing 10, a back plate 16 mounted on a bottom of the PCB 4 and a plurality of fastening members 17 fastening the ILM to the PCB 4. The second terminals 11 can contact with the conductive pads (not shown) of the CPU 3 to achieve electrical connection between the CPU socket 1 and the CPU 3. The ILM includes a metallic stiffener 12 attached to the insulating housing 10, a lever 13 and a load plate 14 pivoted to two opposite ends of the stiffener 12.

The load plate 14 disposed above the CPU 3 after assembled with the electrical connector assembly has a front end 141, a rear end 140 matched with the stiffener 12 and two sides 142 interconnecting the front end 141 with the rear end 140. The front end 141 has a tongue portion 1410 extending from a middle portion thereof. The tongue portion 1410 can match with the lever 13 to make the load plate 14 in an open position or a closed position. A pair of spaced, curved pivot latches 1400 extends from the rear end 140. A tail 1401 extends from the rear end 140 and is arranged between the pivot latches 1400. Each side 142 has a support 143 bent downwardly therefrom. A curved clasp 144 extends toward the rear end 140 from the support 143 for clasping the stiffener 12 to prevent the load plate 14 separating from the stiffener 12 during a rotatable movement of the load plate 14.

The load plate 14 also has a pair of elastic gasket 15 each disposed on a bottom of the side 142 corresponding to the cable connectors 2 soldered on the CPU 3. Each elastic gasket 15 has a plate-like main portion 150 and a pair of posts 151 extending upwardly from a top surface of the main portion 150. The posts 151 can match with corresponding holes 1420 formed on the sides 142 to rivet the elastic gaskets 15 to the load plate 14. A pair of openings 145 each is disposed at a junction of the each side 142 and the corresponding support 143 for the cable 5 passing through. Each opening 145 has a length not less than that of the corresponding elastic gasket 15. A vertical distance from a bottom edge of the opening 145 to the corresponding side 142 is larger than a thickness of the elastic gasket 15, so as to prevent the cable 5 not being assembled to the cable connector 2 which is caused by the cable 5 touching the elastic gasket 15 when passing through the opening 145. Each elastic gasket 15 has a size approximately same with that of the base 20 of the cable connector 2.

The elastic gaskets 15 made of insulative material can press the cables 5 against the cable connectors 2 and lock the cables 5 to the receiving space 22 of the cable connectors 2 when the load plate 14 is in the closed position, so that the conductive points (not shown) of the cable 5 contact with the first terminals 23 to achieve electrical connection between the cable 5 and the cable connector 2 soldered on the CPU 3. Meanwhile the cable 5 further presses the CPU 3, so that the second terminals 11 of the CPU socket 1 contact with the conductive pads (not shown) of the CPU 3 to achieve electrical connection between the CPU 3 and the CPU socket 1. The CPU socket 1 and the cable connector 2 establish electrical connections both through the load plate 14 instead of two independent loading members respectively for the cable connector 2 and the CPU socket 1, so as to simplify the structure of the electrical connector assembly 100 and reduce cost. In addition, the cable connectors 2 are directly soldered on the CPU 3 and achieve electrical connection between the CPUs 3 through the cables 5, so as to shorten signal transmission paths between the CPUs 3 and improve the transmission speed between the CPUs 3.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector assembly comprising:
   a central processing unit (CPU) coupled to a printed circuit board (PCB) and having a substrate having a plurality of conductive pads located at a lower surface thereof and a cable connector located at an upper surface thereof;
   a cable interconnected to the corresponding cable connector; and
   an independent loading mechanism (ILM) including an elastic gasket pressed on the cable to provide a pressure for simultaneously achieving electrical connections between the cable and the CPU through the cable connector and between the CPU and the PCB;
   wherein each elastic gasket has a main portion with a smooth bottom surface for pressing the cable and a plurality of posts extending upwardly from a top surface of the main portion; and wherein the load plate has a plurality of holes corresponding to the posts and matching with the posts.

2. An electrical connector assembly comprising:
   a CPU socket having an insulating housing with a plurality of terminals received therein and a load plate positioned upon the insulating housing;
   a central processing unit (CPU) assembled on the CPU socket and having a substrate having a plurality of conductive pads located at a lower surface thereof and a cable connector located at an upper surface thereof;
   at least one conductive cable interconnected to the cable connector; and
   wherein the load plate simultaneously press the cable against the cable connector and the CPU toward the CPU socket for electrically connecting the CPU with the cable and the PCB, the load plate including an opening for the cable passing through so as to be inserted into the cable connector;
   wherein the load plate includes a plurality of elastic gaskets disposed at a bottom thereof, for pressing the cable against the cable connector when the load plate is in a close position; wherein
   each elastic gasket has a main portion with a smooth bottom surface for pressing the cable and a plurality of posts extending upwardly from a top surface of the main portion; and wherein the load plate has a plurality of holes corresponding to the posts and matching with the posts.

3. An electrical connector assembly comprising:
   an insulative housing defining a receiving cavity;
   a plurality of contacts disposed in the housing with contacting sections extending into the receiving cavity;
   an electronic package disposed in the receiving cavity to electrically connect to the contacting sections of the contacts;
   at least one cable electrically connected to an upper side of the electronic package;
   a load plate positioned upon the electronic package, and applying downward forces simultaneously unto not only the cable for electrical connection between the cable and the electronic package but also the electronic package in a balanced manner for electrical connection between the electronic package and the contacts when said load plate is in a locked position.

4. The electrical connector assembly as claimed in claim 3, wherein said load plate is assembled to a frame surrounding the housing and mounted to a printed circuit board on which the housing is seated.

5. The electrical connector assembly as claimed in claim 3, wherein the load plates defines a same mechanism applying the downward forces to both the cable and the electronic package simultaneously.

6. The electrical connector assembly as claimed in claim 3, wherein said load plate is rotatable relative to the housing about a pivot axis extending in a transverse direction, and further defines an opening to allow the cable to extend beyond the housing and the load plate in said transverse direction.

* * * * *